(12) United States Patent  
Schmidt et al.

(10) Patent No.: US 10,971,658 B2
(45) Date of Patent: Apr. 6, 2021

(54) INFRARED EMITTING DEVICE (71) Applicant: Lumileds LLC, San Jose, CA (US)

(72) Inventors: Peter Josef Schmidt, Aachen (DE); Detlef Wiechert, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/393,428

(22) PCT Filed: Sep. 13, 2018

(86) PCT No.: PCT/EP2018/074758
§ 371 (c)(1),
(2) Date: Apr. 24, 2019

(87) PCT Pub. No.: WO2019/063309
PCT Pub. Date: Apr. 4, 2019

(65) Prior Publication Data
US 2020/0220053 A1   Jul. 9, 2020

(30) Foreign Application Priority Data

Sep. 28, 2017 (EP) .................................. 17193784

(51) Int. Cl.
*H01L 33/50* (2010.01)
*C09K 11/77* (2006.01)

(52) U.S. Cl.
CPC ........ *H01L 33/504* (2013.01); *C09K 11/7706* (2013.01); *C09K 11/7758* (2013.01); *C09K 11/7769* (2013.01); *C09K 11/7774* (2013.01)

(58) Field of Classification Search
None
See application file for complete search history.

(56) References Cited

U.S. PATENT DOCUMENTS

| 8,426,871 | B2 | 4/2013 | Rapoport et al. |
| 9,164,316 | B2 | 10/2015 | Chao et al. |
| 2004/0145895 | A1 | 7/2004 | Ouderkirk et al. |
| 2006/0038198 | A1 | 2/2006 | Chua et al. |
| 2010/0320480 | A1 | 12/2010 | Rapoport et al. |
| 2011/0260194 | A1 | 10/2011 | Fuchi et al. |

(Continued)

FOREIGN PATENT DOCUMENTS

| EP | 2380944 A1 | 10/2011 |
| EP | 2595206 A1 | 5/2013 |

(Continued)

OTHER PUBLICATIONS

European Search Report, EP17193784, dated Jan. 11, 2018, 2 pages.

(Continued)

*Primary Examiner* — Alexander G Ghyka (57) ABSTRACT

Embodiments of the invention include a light source and a wavelength converting structure disposed in a path of light emitted by the light source. The wavelength converting structure includes a first phosphor that emits infrared light and a second phosphor that emits visible light. In some embodiments, the light source emits first light, the second phosphor absorbs the first light and emits second light, and the first phosphor absorbs the first light and emits third light and absorbs the second light and emits fourth light.

20 Claims, 4 Drawing Sheets

(56) References Cited

U.S. PATENT DOCUMENTS

| | | | |
|---|---|---|---|
| 2012/0119143 A1 | 5/2012 | Jia et al. | |
| 2012/0248479 A1* | 10/2012 | Anc | B82Y 20/00 257/98 |
| 2014/0377896 A1* | 12/2014 | Kelley | H01L 33/504 438/29 |
| 2015/0357533 A1* | 12/2015 | Tischler | H01L 33/486 257/76 |
| 2018/0274754 A1* | 9/2018 | Kusano | F21V 15/01 |
| 2019/0330527 A1* | 10/2019 | Saidaminov | C09K 11/665 |
| 2020/0035869 A1* | 1/2020 | Schrama | H01L 33/50 |
| 2020/0135986 A1* | 4/2020 | Kusano | H01L 25/13 |

FOREIGN PATENT DOCUMENTS

| | | |
|---|---|---|
| JP | 2756852 B2 | 5/1998 |
| JP | 2007035885 A | 2/2007 |
| JP | 2011233586 A | 11/2011 |
| JP | 2012531043 A | 12/2012 |
| JP | 2013105747 A | 5/2013 |
| JP | 2016170968 A | 9/2016 |
| WO | 2018143198 A1 | 8/2018 |

OTHER PUBLICATIONS

International Search Report, PCT/EP2018/074758, dated Nov. 26, 2018, 2 pages.
PCT Notification of Transmittal of the International Search Report and the Written Opinion of the International Searching Authority, or the Declaration, PCT/EP2018/074758, dated Nov. 26, 2018, 20 pages.
The extended European Search Report corresponding to EP17193784.0 dated Jan. 18, 2018, 8 pages.

* cited by examiner

INFRARED EMITTING DEVICE

CROSS REFERENCE TO RELATED APPLICATIONS

This patent application is a U.S. National Phase application under 35 U.S.C. 371 of International Patent Application No. PCT/EP2018/074758 titled "Infrared Emitting Device" and filed Sep. 13, 2018, which claims benefit of priority to European Patent Application 17193784.0 titled "Infrared Emitting Device" and filed Sep. 30, 2017, both of which are incorporated herein by reference in their entirety.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material such as a phosphor. Such devices are often referred to as phosphor-converted LEDs, or PCLEDs.

DETAILED DESCRIPTION

Embodiments of the invention include devices such as PCLEDs that emit infrared, particularly near-infrared (NIR) radiation, for example via a NIR emitting luminescent material such as a phosphor. For economy of language, infrared radiation may be referred to herein as "light." NIR emitting PCLEDs may be used for any suitable purpose such as for example, NIR spectroscopy.

Figure 1:
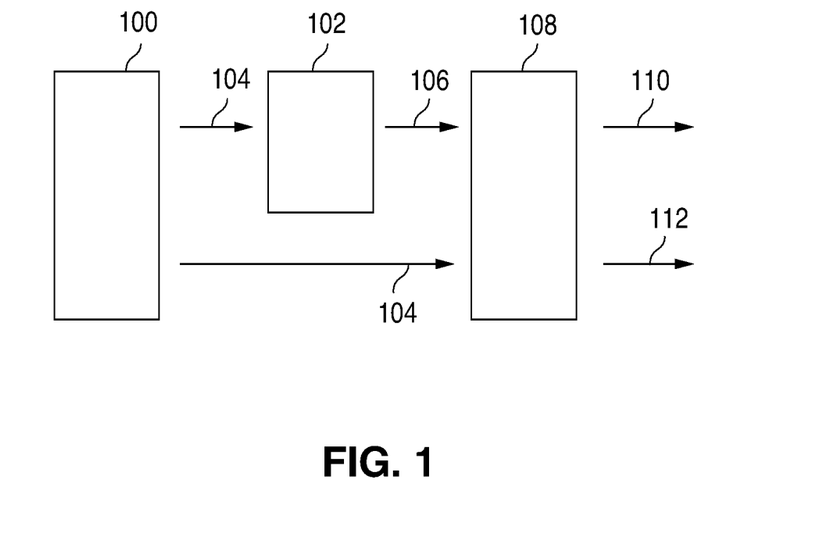
FIG. 1 illustrates a light source according to some embodiments.

FIG. 1 illustrates a NIR emitting device according to some embodiments. A light source 100, which may be an LED or any other suitable source, emits first light 104. A portion of the first light 104 is incident on a NIR phosphor 108. The NIR phosphor 108 absorbs the first light 104 and emits second light 112. A portion of the first light 104 is incident on a second phosphor 102. The second phosphor absorbs the first light 104 and emits third light 106. Third light 106 may be visible, though this is not required. The third light 106 is incident on the NIR phosphor 108. The NIR phosphor 108 absorbs all or a portion of the third light 106 and emits fourth light 110.

The NIR phosphor 108 and the second phosphor 102 may be structured such that little or no first light or third light is part of the final emission spectrum from the device, though this is not required.

In some embodiments, first light 104 is blue light. First light 104 may have a peak wavelength between, for example, 440 nm and 460 nm in some embodiments. In some embodiments, both second light 112 and the fourth light 110 are near-infrared and have different peak wavelengths. In some embodiments, the third light 106 is red.

Wavelength converting materials such as phosphors typically include a host lattice and at least one dopant species. The atoms of the dopant species function as light emitting centers. In some embodiments, NIR phosphor is at least one phosphor with at least Cr(III) ($Cr^{3+}$) as the dopant species. The Cr(III) phosphor is excited by the first light 104 via $^4A_2 \rightarrow {}^4T_1$ electron transitions. The third light 106 excites the Cr(III) phosphor via $^4A_2 \rightarrow {}^4T_2$ electron transitions. The combined excitation lights lead to emission light by the Cr(III) phosphor via $^4T_2 \rightarrow {}^4A_2$ (second light 112) and $^2E \rightarrow {}^4A_2$ (fourth light 110) emission channels.

In some embodiments, the NIR phosphor contains more than one chemically different Cr(III) emission sites, which emit via the different emission channels as described above. In some embodiments, emission by the two channels described above may be achieved by (a) a crystalline phosphor material made up of an ordered structure with more than one substitutional position for a dopant, such as $La_3GaGe_5O_{16}:Cr$ with $Cr^{3+}$ on Ge sites, (b) a solid solution or mixed crystal type phosphor where different crystal types emit via different emission channels, such as $La_3Ga_{5-y}SiO_{14}:Cr_y$, where $Si^{4+}$ and $Ga^{3+}$ occupy the same lattice site statistically or (c) a glass or amorphous material, such as a $GeO_2$—$Al_2O_3$—$LaF_3$—$LiF$—$Cr_2O_3$ fluorogermanate type glass.

The device illustrated in FIG. 1 may have a very broad infrared emission range between 700 nm and 1200 nm, with only one type of pump light. The broad emission range may be useful for NIR spectroscopy applications.

The NIR phosphor 108 may emit light having a peak wavelength of at least 700 nm in some embodiments and no more than 1100 nm in some embodiments. NIR phosphor 108 may have a distributed emission intensity within the 700-1100 nm range; for example, in some embodiments, NIR phosphor 108 may have a full width at half maximum of at least 1700 cm$^{-1}$ in some embodiments and no more than 3000 cm$^{-1}$ in some embodiments.

NIR phosphor 108 may be excited, for example, by light in the visible spectral range, meaning that it absorbs visible light, and in response, emit NIR light. The band gap of the NIR phosphor 108 may be at least 4.8 eV in some embodiments and greater than 5 eV in some embodiments.

In some embodiments, as described above NIR phosphor 108 includes trivalent cations such as Cr(III) (Cr(III) is the same as $Cr^{3+}$) as emitting centers. In some embodiments, the host lattice of NIR phosphor 108 includes tetravalent cations that show effective ionic radii that are at least 10% smaller than the effective ionic radius of Cr(IV) (Cr(IV) is the same as $Cr^{4+}$). The tetravalent cation may be $Si^{4+}$ with an effective ionic radius for fourfold coordination that is 38% smaller than the effective ionic radius of $Cr^{4+}$. The small tetravalent cation size may suppress the formation of unwanted Cr(IV), which may improve the stability of the NIR phosphor and may increase the luminescence conversion efficiency of the NIR phosphor at elevated temperatures. The NIR phosphor contains less than 10% Cr(IV) in some embodiments, less than 5% Cr(IV) in some embodiments, less than 1% Cr(IV) in some embodiments, and 0% Cr(IV) in some embodiments, relative to the total chromium content in the NIR phosphor.

In some embodiments, the NIR phosphor 108 has a host lattice belonging to the trigonal calcium gallogermanate structure family crystallizing in the polar space group P321. Suitable calcium gallogermanate materials may have a compositional range $RE_3Ga_{5-x-y}A_xSiO_{14}:Cr_y$, (RE=La, Nd, Gd, Yb, Tm; A=Al, Sc), where $0 \leq x \leq 1$ and $0.005 \leq y \leq 0.1$.

In some embodiments, the NIR phosphor 108 has a calcium gallogermanate or garnet crystal structure host lattice including a quantity of divalent trace metals like Mg, Ca, Yb, Sr, Eu, Ba, Zn, Cd. The concentration of divalent trace metals is kept low, less than 400 ppm in some embodiments and less than 100 ppm in some embodiments.

In some embodiments, the NIR phosphor 108 is $La_3Ga_{5-y}SiO_{14}:Cr_y$, also known as Langasite, which shows an optical band gap at 5.1 eV. In some embodiments, the NIR phosphor 108 is one or more gallogermanate compounds of composition $La_3Ga_{5-x}Ge_{1-y}Si_yO_{14}:Cr_x$, $0 \leq y < 1$, which show optical band gaps in the range of 4.6-5.1 eV. In some embodiments, the optical band gap of a gallogermanate material may be increased by partial substitution of Ga by Al and/or Sc, and/or by replacing part of the La by the smaller rare earth elements Nd, Gd, and Yb. $Nd^{3+}$ and $Yb^{3+}$ show additional emission in the 950-1070 nm wavelength range which can be beneficial for certain applications.

In some embodiments, the NIR phosphor 108 includes multiple NIR phosphors that are mixed. For example, $RE_3Ga_{5-x-y}A_xSiO_{14}:Cr_y$ (RE=La, Nd, Gd, Yb, Tm; A=Al, Sc) may be combined with a second wide band gap phosphor material such as one or more chromium doped garnets of composition $Gd_{3-x}RE_xSc_{2-y-z}Ln_yGa_{3-w}Al_wO_{12}:Cr_z$ (Ln=Lu, Y, Yb, Tm; RE=La, Nd), where $0 \leq x \leq 3$; $0 \leq y \leq 1.5$; $0 \leq z \leq 0.3$; and $0 \leq w \leq 2$, and/or one or more chromium doped colquiriite materials of composition $AAEM_{1-x}F_6:Cr_x$ (A=Li, Cu; AE=Sr, Ca; M=Al, Ga, Sc) where $0.005 \leq x \leq 0.2$.

Figure 2:
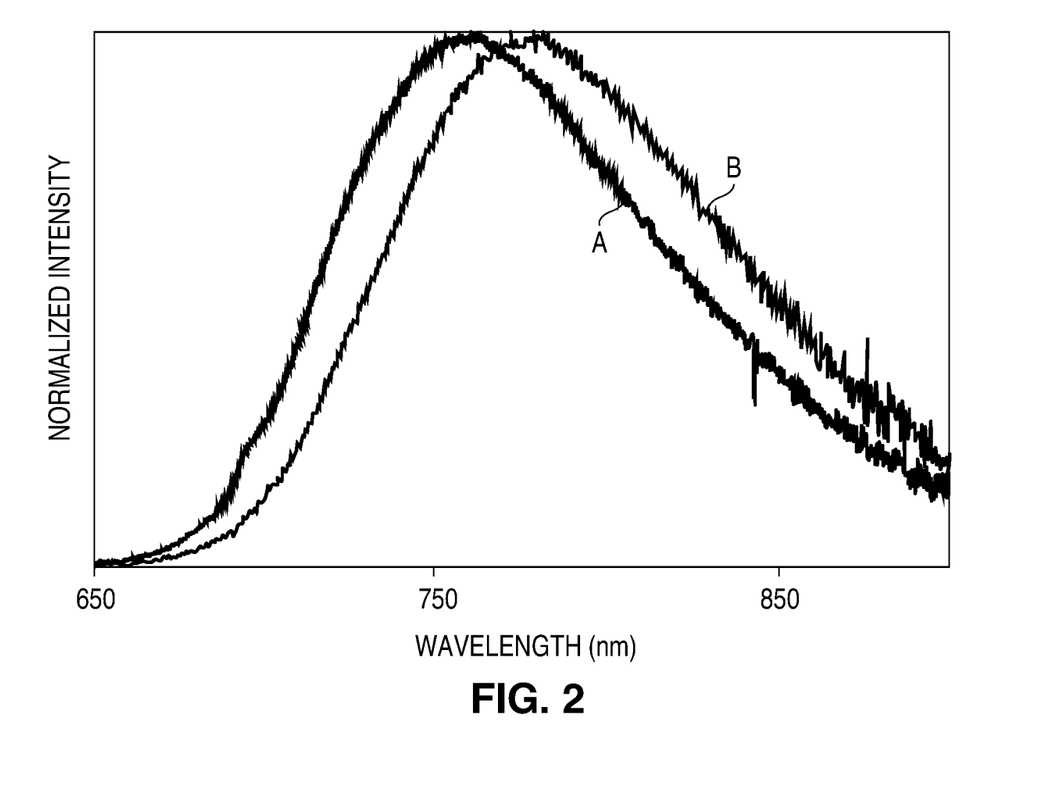
FIG. 2 illustrates the emission spectra of two near-infrared emitting phosphors according to some embodiments.

FIG. 2 illustrates the emission spectra of two garnet NIR phosphor powders according to some embodiments. Curve A is the emission spectrum of $Gd_{2.8}La_{0.2}Sc_{1.7}Lu_{0.2}Ga_3O_{12}:Cr_{0.1}$ when excited by 440 nm light. Curve B is the emission spectrum of $Gd_{2.4}La_{0.6}Sc_{1.5}Lu_{0.4}Ga_3O_{12}:Cr_{0.1}$ when excited by 440 nm light. The synthesis of these materials is described below in the Examples.

Any suitable second phosphor 102 may be used. In some embodiments, second phosphor 102 is an $Eu^{2+}$ doped red emitting material such as BSSNE type phosphors of composition $M_{2-x}Si_{5-y}Al_yO_yN_{8-y}:Eu_x$ (M=Ba, Sr, Ca), such as, for example $Ba_{0.2}Ca_{0.06}Sr_{1.64}Si_{4.98}Al_{0.02}O_{0.02}N_{7.98}:Eu_{0.1}$; CASN or SCASN type phosphors of composition $M_{1-x}SiAlN_3:Eu_x$ (M=Sr, Ca) such as, for example $Ca_{0.985}SiAlN_3:Eu_{0.015}$; or $M_{1-x}LiAl_3N_4:Eu_x$ (M=Ba, Sr, Ca) such as, for example, $(Ba_{0.5}Ca_{0.5})_{0.995}LiAl_3N_4:Eu_{0.005}$, which may crystallize in an ordered structure variant of the $UCr_4C_4$ structure type with Ba and Ca occupying specific lattice sites. Similar ordered variants are known for oxides like $RbNaLi_6Si_2O_8$. In$(Ba_{0.5}Ca_{0.5})_{1.8}LiAl_3N_4:Eu_x$ narrow band emission at ~630 nm is obtained for Eu on Ba sites while NIR emission at wavelengths >700 nm is obtained for Eu on Ca sites.

Figure 3:
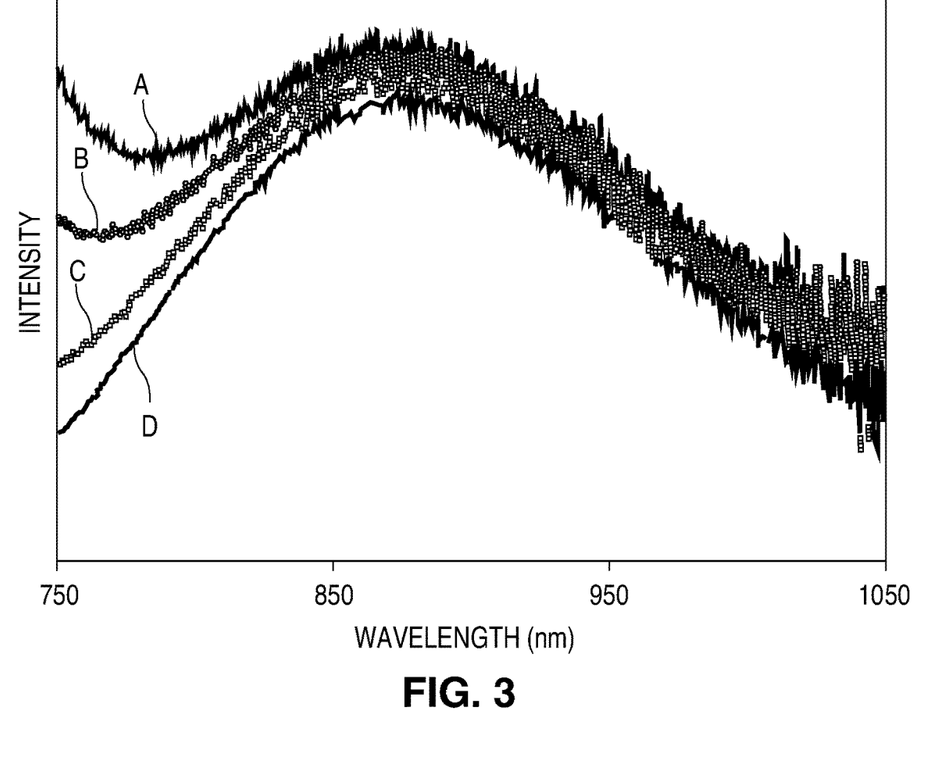
FIG. 3 illustrates the emission spectra of blue emitting LEDs combined with mixtures of near infrared emitting phosphors and red phosphors.

In one embodiment, NIR phosphor 108 is a langasite type phosphor of composition $La_3Ga_{4.98}SiO_{14}:Cr_{0.02}$ and second phosphor 102 is a CASN type phosphor of composition $Ca_{0.985}SiAlN:Eu_{0.015}$. CASN type red emitting phosphors are commercially available from e.g. Mitsubishi Chemical (BR-101 series). FIG. 3 shows emission spectra for various mixtures. Curve A illustrates the emission, when pumped by an LED emitting at 445 nm, of $La_3Ga_{4.98}SiO_{14}:Cr_{0.02}$. Curve B illustrates the emission, when pumped by an LED emitting at 445 nm, of a mixture of $La_3Ga_{4.98}SiO_{14}:Cr_{0.02}$+ 0.5 wt % $Ca_{0.985}SiAlN:Eu_{0.015}$. Curve C illustrates the emission, when pumped by an LED emitting at 445 nm, of a mixture of $La_3Ga_{4.98}SiO_{14}:Cr_{0.02}$+1.6 wt % $Ca_{0.985}SiAlN:Eu_{0.015}$. Curve D illustrates the emission, when pumped by an LED emitting at 445 nm, of a mixture of $La_3Ga_{4.98}SiO_{14}:Cr_{0.02}$+3.2 wt % $Ca_{0.985}SiAlN:Eu_0.015$. As illustrated in FIG. 3, the emission intensity is significantly enhanced even at wavelengths where the emission bands of the red emitting $Eu^{2+}$ phosphor 102 and the $Cr^{3+}$ phosphor 108 are not overlapping.

In another embodiment, an additional garnet type phosphor of composition $Gd_{2.4}La_{0.6}Sc_{1.5}Lu_{0.4}Ga_3O_{12}:Cr_{0.1}$ (5 wt %) showing an emission maximum at 776 nm is mixed with 1.6 wt % $Ca_{0.985}SiAlN:Eu_{0.015}$ and 93.4 wt % $La_3Ga_{4.98}SiO_{14}:Cr_{0.02}$ into silicone and deposited onto a blue emitting LED die (444 nm emission).

The NIR phosphor 108 and the second phosphor 102 described above can be manufactured, for example, in powder form, in ceramic form, or in any other suitable form. The NIR phosphor 108 and the second phosphor 102 may be formed into one or more structures that are formed separately from and can be handled separately from the light source, such as a prefabricated glass or ceramic tile, or may be formed into a structure that is formed in situ with the light source, such as a conformal or other coating formed on or above the source.

The NIR phosphor 108 and the second phosphor 102 may be mixed together in a single wavelength converting layer, or formed as separate wavelength converting layers. In a structure with separate wavelength converting layers, NIR phosphor 108 and the second phosphor 102 may be stacked such that the second phosphor 102 may be disposed between the NIR phosphor 108 and the light source, or the NIR phosphor 108 may be disposed between the second phosphor 102 and the light source.

In some embodiments, the NIR phosphor 108 and the second phosphor 102 may be powders that are dispersed for example in a transparent matrix, a glass matrix, a ceramic matrix, or any other suitable material or structure. Phosphor dispersed in a matrix may be, for example, singulated or formed into a tile that is disposed over a light source. The glass matrix may be for example a low melting glass with a softening point below 1000° C., or any other suitable glass or other transparent material. The ceramic matrix material can be for example a fluoride salt such as $CaF_2$ or any other suitable material.

The NIR phosphor 108 and second phosphor 102 may be used in powder form, for example by mixing the powder phosphor with a transparent material such as silicone and dispensing or otherwise disposing it in a path of light. In powder form, the average particle size (for example, particle diameter) of the phosphors may be at least 1 μm in some embodiments, no more than 50 μm in some embodiments, at least 5 μm in some embodiments, and no more than 20 μm in some embodiments. Individual phosphor particles, or powder phosphor layers, may be coated with one or more materials such as a silicate, a phosphate, and/or one or more oxides in some embodiments, for example to improve absorption and luminescence properties and/or to increase the material's functional lifetime.

Figure 4:
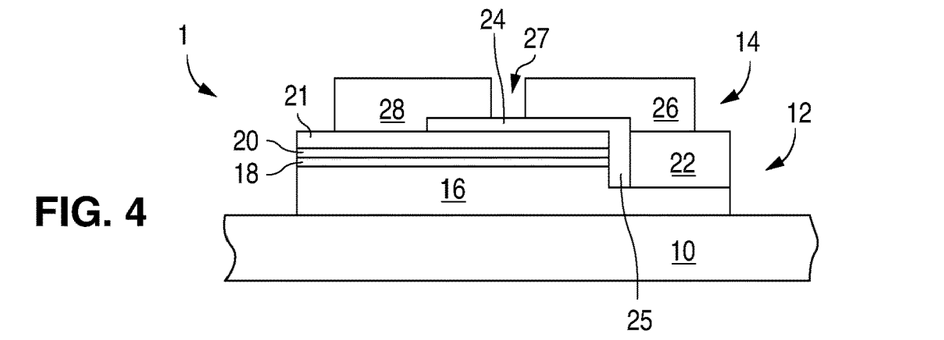
FIG. 4 is a cross sectional view of an LED.

The NIR phosphor 108 and second phosphor 102 may be used, for example, in a light source including a light emitting diode (LED). Light emitted by the light emitting diode is absorbed by the phosphors according to embodiments of the invention and emitted at a different wavelength. FIG. 4 illustrates one example of a suitable light emitting diode, a III-nitride LED that emits blue light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

FIG. 4 illustrates a III-nitride LED 1 that may be used in embodiments of the present invention. Any suitable semiconductor light emitting device may be used and embodiments of the invention are not limited to the device illustrated in FIG. 4. The device of FIG. 4 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 4. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 4. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the invention. The invention is not limited to the particular LED illustrated in FIG. 4. The light source, such as, for example, the LED illustrated in FIG. 4, is illustrated in the following figures by block 1.

Figure 5:
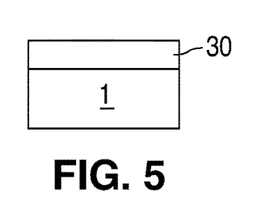
FIG. 5 is a cross sectional view of a device with a wavelength converting structure in direct contact with an LED.
Figure 6:
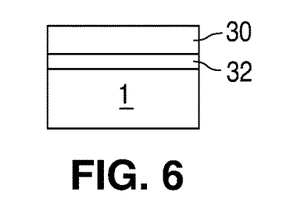
FIG. 6 is a cross sectional view of a device with a wavelength converting structure in close proximity to an LED.
Figure 7:
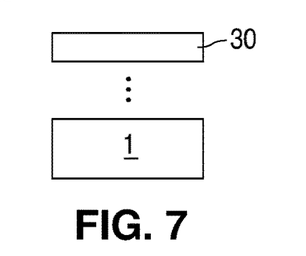
FIG. 7 is a cross sectional view of a device with a wavelength converting structure spaced apart from an LED.

FIGS. 5, 6, and 7 illustrate devices that combine an LED 1 and a wavelength converting structure 30. The wavelength converting structure 30 may include NIR phosphor 108 and second phosphor 102, according to the embodiments and examples described above.

In FIG. 5, the wavelength converting structure 30 is directly connected to the LED 1. For example, the wavelength converting structure may be directly connected to the substrate 10 illustrated in FIG. 4, or to the semiconductor structure, if the substrate 10 is removed.

In FIG. 6, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 μm in some embodiments.

In FIG. 7, the wavelength converting structure 30 is spaced apart from LED 1. The spacing between LED 1 and the wavelength converting structure 30 may be, for example, on the order of millimeters in some embodiments. Such a device may be referred to as a "remote phosphor" device.

The wavelength converting structure 30 may be square, rectangular, polygonal, hexagonal, circular, or any other suitable shape. The wavelength converting structure may be the same size as LED 1, larger than LED 1, or smaller than LED 1.

Multiple wavelength converting materials and multiple wavelength converting structures can be used in a single device. Examples of wavelength converting structures include luminescent ceramic tiles; powder phosphors that are disposed in transparent material such as silicone or glass that is rolled, cast, or otherwise formed into a sheet, then singulated into individual wavelength converting structures; wavelength converting materials such as powder phosphors that are disposed in a transparent material such as silicone that is formed into a flexible sheet, which may be laminated or otherwise disposed over an LED 1, wavelength converting materials such as powder phosphors that are mixed with a transparent material such as silicone and dispensed, screen printed, stenciled, molded, or otherwise disposed over LED 1; and wavelength converting materials that are coated on LED 1 or another structure by electrophoretic, vapor, or any other suitable type of deposition.

A device may also include other wavelength converting materials in addition to the NIR phosphor 108 and second phosphor 102 described above, such as, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting materials absorb light emitted by the LED and emit light of one or more different wavelengths. Unconverted light emitted by the LED is often part of the final spectrum of light extracted from the structure, though it need not be. Wavelength converting materials emitting different wavelengths of light may be included to tailor the spectrum of light extracted from the structure as desired or required for a particular application.

Multiple wavelength converting materials may be mixed together or formed as separate structures.

In some embodiments, other materials may be added to the wavelength converting structure or the device, such as, for example, materials that improve optical performance, materials that encourage scattering, and/or materials that improve thermal performance.

EXAMPLES

1. Synthesis of $La_3Ga_{4.98}SiO_{14}:Cr_{0.02}$.

Figure 8:
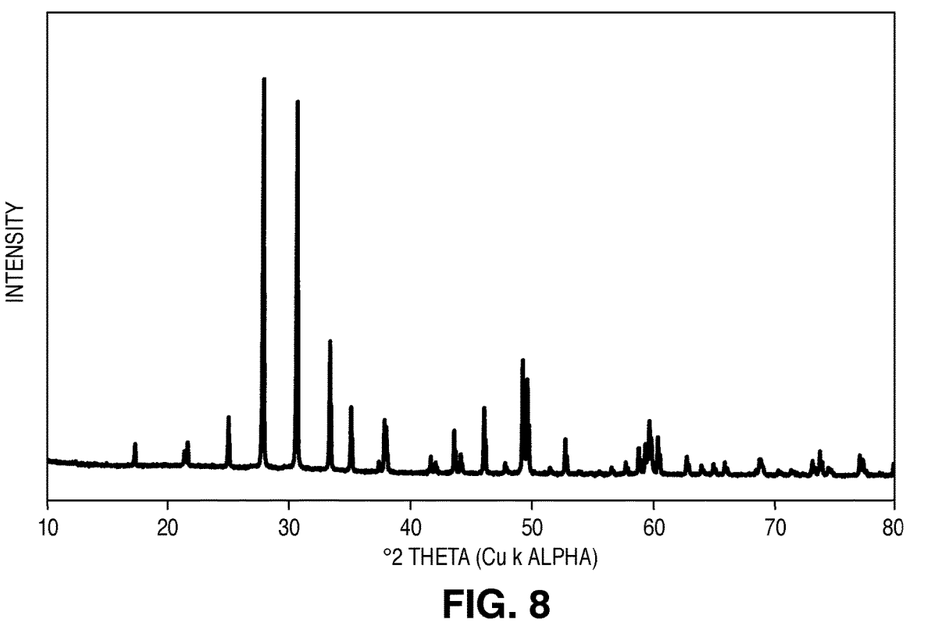
FIG. 8 is an X-ray diffraction (XRD) pattern of synthesized $La_3Ga_{4.98}SiO_{14}:Cr_{0.02}$.

The starting materials 4.805 g lanthanum oxide (Auer Remy, 4N), 4.589 g gallium oxide (Alfa, 5N), 0.0149 g chromium (III) oxide (Alfa, 99%), 0.591 g fumed silica (Evonik) and 0.1 g boric acid (Aldrich) are mixed in ethanol, dried at 100° C. and fired under carbon monoxide at 1300° C. for 4 hrs. After ball milling, the powder is washed with water, dried and sieved. Single phase $La_3Ga_{4.98}SiO_{14}:Cr_{0.02}$ is obtained. FIG. 8 is an X-ray diffraction (XRD) pattern of the synthesized $La_3Ga_{4.98}SiO_{14}:Cr_{0.02}$, crystallizing in the calcium gallogermanate structure with $a_0$=8.163 Å and $c_0$=5.087 Å.

2. Synthesis of $La_3Ga_{4.48}Al_{0.5}SiO_{14}:Cr_{0.02}$.

Figure 9:
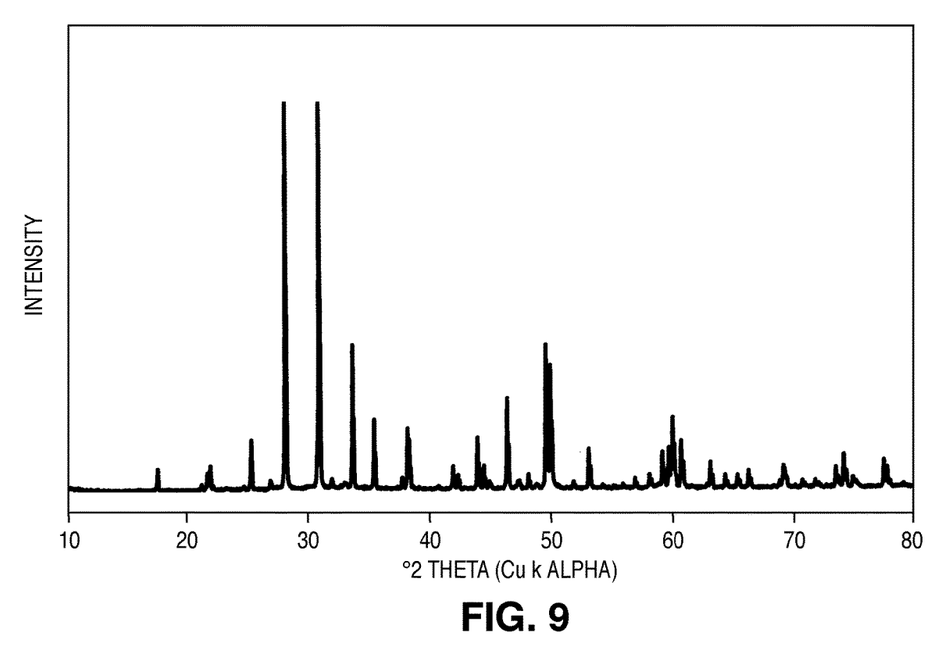
FIG. 9 is an XRD pattern of synthesized $La_3Ga_{4.48}Al_{0.5}SiO_{14}:Cr_{0.02}$.

The starting materials 9.8182 g lanthanum oxide (Auer Remy, 4N), 8.4354 g gallium oxide (Molycorp, UHP grade), 0.0314 g chromium (III) oxide (Alfa, 99%), 1.208 g fumed silica (Evonik), 0.5136 g alumina (Baikowski) and 0.2005 g boric acid (Aldrich) are mixed in ethanol, dried at 100° C. and fired under carbon monoxide at 1320° C. for 4 hrs and under forming gas at 1000° C. for another 4 hrs. After ball milling, the powder is washed with water, dried and sieved. FIG. 9 is an XRD pattern of the synthesized $La_3Ga_{4.48}Al_{0.5}SiO_{14}:Cr_{0.02}$, crystallizing in the calcium gallogermanate structure with $a_0$=8.146 Å and $c_0$=5.075 Å.

3. Synthesis of $Gd_{2.8}La_{0.2}Sc_{1.7}Lu_{0.2}Ga_3O_{12}:Cr_{0.1}$.

Figure 10:
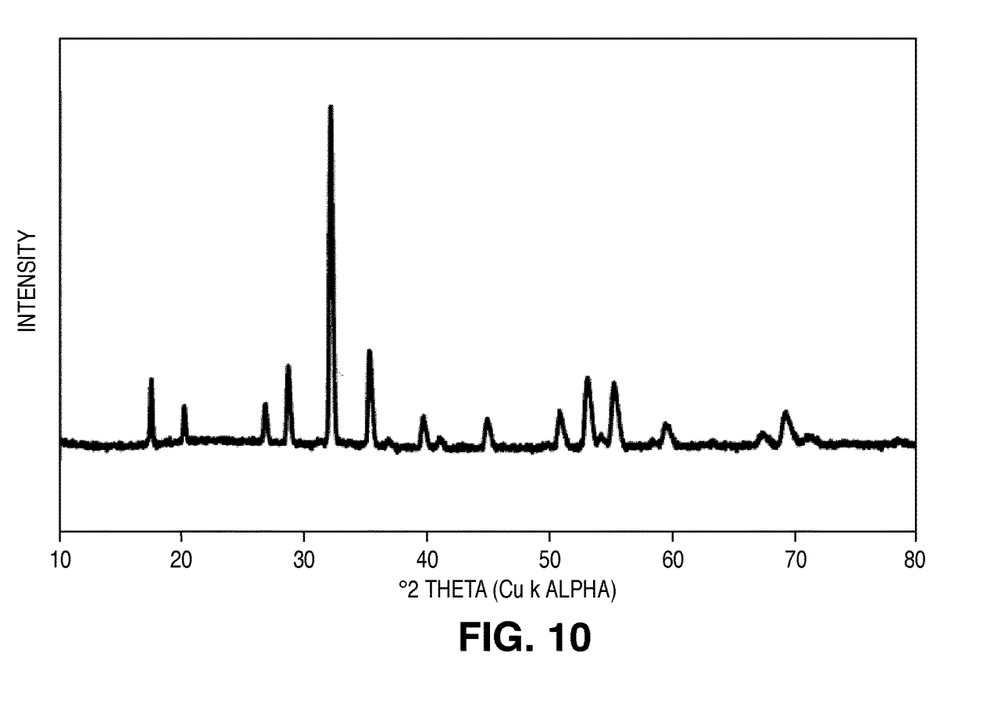
FIG. 10 is an XRD pattern of synthesized $Gd_{2.8}La_{0.2}Sc_{1.7}Lu_{0.2}Ga_3O_{12}:Cr_{0.1}$.

The starting materials 5.148 g gadolinium oxide (Rhodia, superamic grade), 1.189 g scandium oxide (Alfa Aesar, 4N), 0.404 g luthetium oxide (Rhodia), 2.852 g gallium oxide (Alfa Aesar, 4N), 0.0771 g chromium (III) oxide (Alfa, 99%), 0.3305 g lanthanum oxide (Auer Remy, 4N) and 0.2 g barium fluoride (Alfa Aesar) are mixed and fired at 1500° C. for 4h in air atmosphere. After crushing and ball milling, the powder is washed in hot water, dried and sieved. FIG. 10 is an XRD pattern of the synthesized $Gd_{2.8}La_{0.2}Sc_{1.7}Lu_{0.2}Ga_3O_{12}:Cr_{0.1}$, crystallizing in the garnet structure with $a_0$=12.440 Å.

4. Synthesis of $Gd_{2.4}La_{0.6}Sc_{1.5}Lu_{0.4}Ga_3O_{12}:Cr_{0.1}$.

Figure 11:
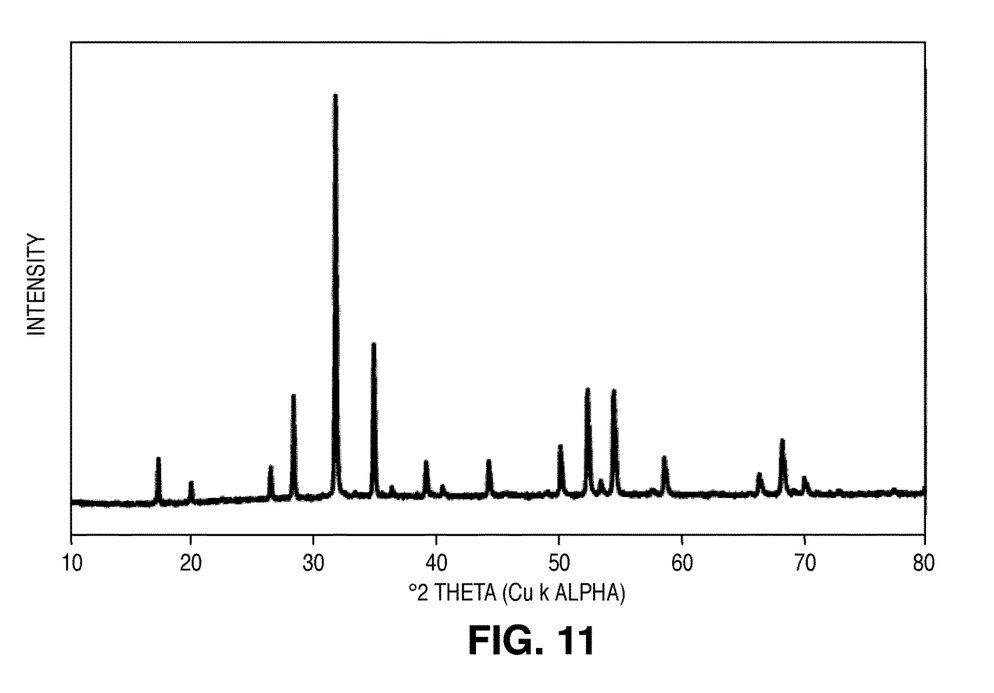
FIG. 11 is an XRD pattern of synthesized $Gd_{2.4}La_{0.6}Sc_{1.5}Lu_{0.4}Ga_3O_{12}:Cr_{0.1}$.

The starting materials 4.330 g gadolinium oxide (Rhodia, superamic grade), 1.103 g scandium oxide (Alfa Aesar, 4N), 0.792 g luthetium oxide (Rhodia), 2.799 g gallium oxide (Alfa Aesar, 4N), 0.0757 g chromium (III) oxide (Alfa, 99%), 0.9730 g lanthanum oxide (Auer Remy, 4N) and 0.2 g barium fluoride (Alfa Aesar) are mixed and fired at 1550° C. for 4h in air atmosphere. After milling the powder is fired again for 4 hrs at 1400° C. in a carbon monoxide atmosphere. After crushing and ball milling, the powder is washed in hot water, dried and sieved. FIG. 11 is an XRD pattern of the synthesized $Gd_{2.4}La_{0.6}Sc_{1.5}Lu_{0.4}Ga_3O_{12}:Cr_{0.1}$, crystallizing in the garnet structure with $a_0$=12.604 Å.

5. Synthesis of $SrLiAl_{0.995}F_6:Cr_{0.005}$.

The starting materials $AlF_3$ (99.99%, anhydrous), LiF (99.999%), $SrF_2$ (99.99%, dry) and $CrF_3$ (99.98%, anhydrous) are mixed under argon and transferred in a platinum crucible. After firing at 600° C. for 4 hrs under argon atmosphere, the resulting powder cake is milled under ethanol and dried.

6. Phosphor mixtures.

For infrared illumination applications like NIR spectroscopy it is often preferable to have a broad, continuous emission intensity distribution. Accordingly, in some embodiments, the NIR phosphor 108 includes one or more longer wavelength emitting materials, for example from the class of Cr doped calcium gallogermanate type phosphors illustrated by e.g. examples 1) and 2), combined with one or more shorter wavelength emitting materials, for example from the class of Cr doped garnets illustrated by e.g. examples 3) and 4), and/or with materials from the class of Cr doped colquirite materials illustrated by e.g. example 5).

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:
1. A device comprising:
a light source emitting a first light; and
a wavelength converting structure disposed in a path of the first light emitted by the light source, the wavelength converting structure comprising:
a first phosphor; and
a second phosphor;
the second phosphor absorbing the first light and emitting a second light, which second light is visible light, the first phosphor absorbing the first light and emitting a third light, the first phosphor absorbing the second light and emitting a fourth light, the third light and the fourth light have different peak wavelengths in the infrared emission range.

2. The device of claim 1 wherein the first light is blue light and the second light is red light.

3. The device of claim 1 wherein the first phosphor comprises a Cr(III) phosphor that is excited by the first light via $^4A_2 \rightarrow T_1$ electron transitions and is excited by the second light via $^4A_2 \rightarrow T_2$ electron transitions.

4. The device of claim 1 wherein the first phosphor comprises a crystalline phosphor material made up of an ordered structure with more than one substitutional position for a dopant.

5. The device of claim 1 wherein the first phosphor comprises one of a solid solution and a mixed crystal type phosphor where different crystal types emit via different emission channels.

6. The device of claim 1 wherein the first phosphor comprises a glass or amorphous material.

7. The device of claim 1 wherein the first phosphor comprises $RE_3Ga_{5-x-y}A_xSiO_{14}:Cr_y$ (RE=La, Nd, Gd, Yb, Tm; A=Al, Sc), where $0 \leq x \leq 1$ and $0.005 \leq y \leq 0.1$.

8. The device of claim 1 wherein the first and second phosphors are mixed with a transparent material and disposed over the light source.

9. The device of claim 1, wherein the first phosphor comprises trivalent cations as emitting centers.

10. The device of claim 1, wherein the first phosphor comprises a host lattice comprising tetravalent cations.

11. The device of claim 10, wherein the tetravalent cation is $Si^4$.

12. The device of claim 1, wherein the first phosphor comprises Cr(IV), a amount of Cr(IV) in the first phosphor being less than 10% total chromium content in the first phosphor.

13. The device of claim 1, wherein the first phosphor comprises Cr(IV), a amount of Cr(IV) in the first phosphor being less than 5% total chromium content in the first phosphor.

14. The device of claim 1, wherein the first phosphor comprises Cr(IV), a amount of Cr(IV) in the first phosphor being less than 1% total chromium content in the first phosphor.

15. The device of claim 1, wherein the first phosphor comprises a host lattice belonging to a trigonal calcium gallogermanate structure family crystallizing in polar space group P321.

16. The device of claim 1, wherein the first phosphor comprises $La_3Ga_{5y}SiO_{14}:Cr_y$.

17. The device of claim 1, wherein the first phosphor comprises $Gd_{3-x}RE_xSc_{2-y-z}Ln_yGa_{3-w}Al_wO_{12}:Cr_z$, where Ln=Lu, Y, Yb, Tm; RE=La, Nd, $0 \leq X \leq 3$; $0 \leq y \leq 1.5$; $0 \leq z \leq 0.3$ and $0 \leq w \leq 2$.

18. The device of claim 1, wherein the first phosphor comprises $AAEM_{1-x}F_6:Cr_x$, where A=Li, Cu; AE=Sr, Ca; M=Al, Ga, Sc; and $0.005 \leq x \leq 0.2$.

19. The device of claim 7, wherein the first phosphor comprises $Gd_{3-x}RE_xSc_{2-y-z}Ln_yGa_{3-w}Al_wO_{12}:Cr_z$, where Ln=Lu, Y, Yb, Tm; RE=La, Nd, $0 \leq X \leq 3$; $0 \leq y \leq 1.5$; $0 \leq z \leq 0.3$ and $0 \leq w \leq 2$.

20. The device of claim 7, wherein the first phosphor comprises $AAEM_{1-x}F_6:Cr_x$, where A=Li, Cu; AE=Sr, Ca; M=Al, Ga, Sc; and $0.005 \leq x \leq 0.2$.

* * * * *